United States Patent
Shimizu et al.

(10) Patent No.: US 9,305,875 B2
(45) Date of Patent: Apr. 5, 2016

(54) METHOD OF MANUFACTURING SEMICONDUCTOR DEVICE CAPABLE OF ENHANCING BONDING STRENGTH BETWEEN CONNECTION TERMINAL AND ELECTRODE

(71) Applicant: FUJITSU LIMITED, Kawasaki-shi, Kanagawa (JP)

(72) Inventors: Kozo Shimizu, Atsugi (JP); Seiki Sakuyama, Isehara (JP); Toyoo Miyajima, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/063,866

(22) Filed: Oct. 25, 2013

(65) Prior Publication Data

US 2014/0210086 A1    Jul. 31, 2014

(30) Foreign Application Priority Data

Jan. 28, 2013 (JP) ................. 2013-013433

(51) Int. Cl.
*H01L 23/498* (2006.01)
*H01L 21/768* (2006.01)
(Continued)

(52) U.S. Cl.
CPC .......... *H01L 23/49866* (2013.01); *B23K 35/24* (2013.01); *H01L 21/76843* (2013.01); *H01L 23/49811* (2013.01); *H01L 24/05* (2013.01); *H01L 24/13* (2013.01); *H01L 24/81* (2013.01); *H05K 3/3463* (2013.01); *H05K 3/3494* (2013.01); *H01L 24/03* (2013.01); *H01L 24/16* (2013.01); *H01L 2224/03462* (2013.01); *H01L 2224/03464* (2013.01); *H01L 2224/0401* (2013.01); *H01L 2224/05082* (2013.01);
(Continued)

(58) Field of Classification Search
CPC ............ H01L 2224/81801; H01L 2224/8121; H01L 2224/81815; H01L 2224/8183; H01L 23/49866; H05K 3/36; H05K 3/363; H05K 3/3494

See application file for complete search history.

(56) References Cited

U.S. PATENT DOCUMENTS

| 2002/0009384 A1* | 1/2002 | Habu et al. ................... 420/557 |
| 2003/0036255 A1* | 2/2003 | Sukuyama ................... 438/613 |

(Continued)

FOREIGN PATENT DOCUMENTS

| JP | 2010-167472 | 8/2010 |
| JP | 2012-157873 | 8/2012 |

(Continued)

OTHER PUBLICATIONS

TWOA—Office Action of Taiwan Patent Application No. 102138054 dated Apr. 10, 2015, with partial English translation.

(Continued)

*Primary Examiner* — Tucker J Wright
(74) *Attorney, Agent, or Firm* — Fujitsu Patent Center

(57) ABSTRACT

A method of manufacturing a semiconductor device includes forming a barrier metal film on a surface of at least one of a first electrode of a wiring board and a second electrode of a semiconductor element, providing a connection terminal between the first and second electrodes, the connection terminal being made of solder containing tin, bismuth and zinc, and bonding the connection terminal to the barrier metal film by heating the connection terminal and maintaining the temperature of the connection terminal at a constant temperature not lower than a melting point of the solder for a certain period of time.

11 Claims, 11 Drawing Sheets

(51) Int. Cl.
*H01L 23/00* (2006.01)
*H05K 3/34* (2006.01)
*B23K 35/24* (2006.01)
*H05K 3/24* (2006.01)

(52) U.S. Cl.
CPC ........... *H01L2224/05083* (2013.01); *H01L 2224/05147* (2013.01); *H01L 2224/05155* (2013.01); *H01L 2224/05164* (2013.01); *H01L 2224/05647* (2013.01); *H01L 2224/13111* (2013.01); *H01L 2224/13113* (2013.01); *H01L 2224/16225* (2013.01); *H01L 2224/16227* (2013.01); *H01L 2224/16501* (2013.01); *H01L 2224/73204* (2013.01); *H01L 2224/81075* (2013.01); *H01L 2224/81211* (2013.01); *H01L 2224/81815* (2013.01); *H01L 2924/01322* (2013.01); *H01L 2924/15311* (2013.01); *H05K 3/244* (2013.01); *H05K 3/3436* (2013.01); *H05K 2201/10734* (2013.01)

(56) References Cited

U.S. PATENT DOCUMENTS

| | | | |
|---|---|---|---|
| 2004/0084206 A1* | 5/2004 | Tung | 174/255 |
| 2005/0023327 A1* | 2/2005 | Pendse | 228/180.22 |
| 2005/0070084 A1 | 3/2005 | Hsu et al. | |
| 2006/0278999 A1 | 12/2006 | Hsu et al. | |
| 2012/0193800 A1* | 8/2012 | Akamatsu et al. | 257/772 |

FOREIGN PATENT DOCUMENTS

| | | |
|---|---|---|
| TW | 200409575 | 6/2004 |
| TW | 200512910 | 4/2005 |
| TW | 200512911 | 4/2005 |
| TW | 201011879 | 3/2010 |
| TW | 201231206 | 8/2012 |

OTHER PUBLICATIONS

TWOA—Office Action of Taiwanese Patent Application No. 102138054 dated Aug. 17, 2015, with full English translation.

* cited by examiner

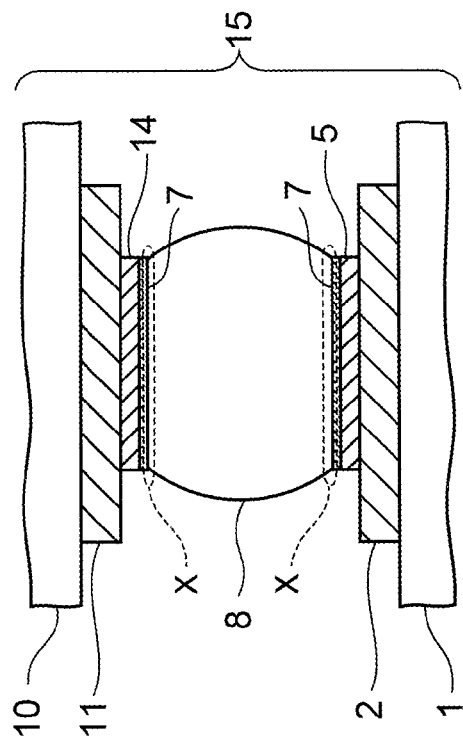
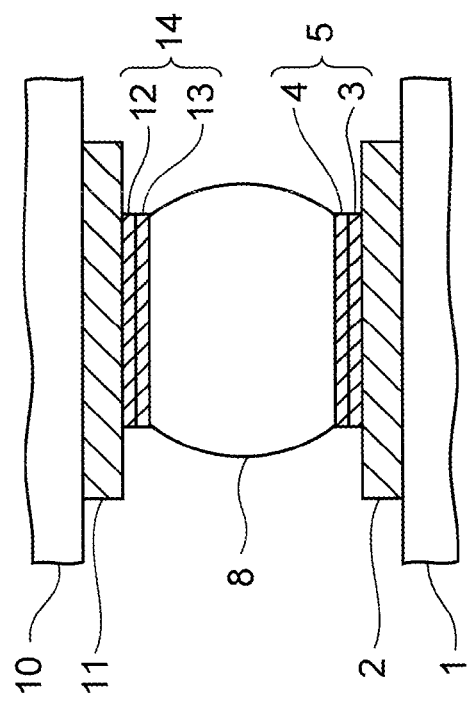

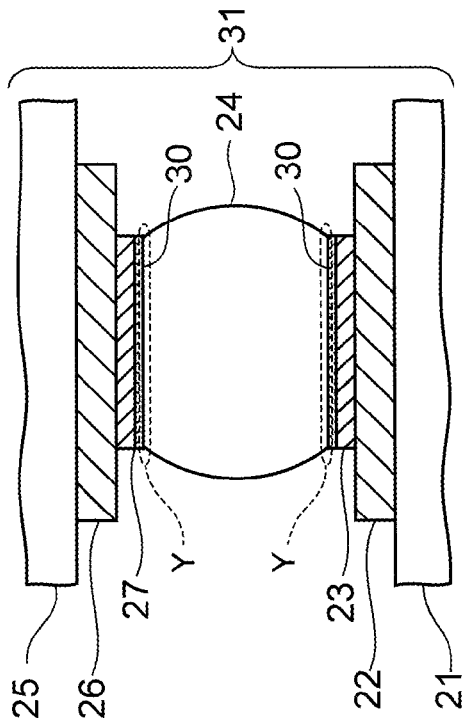
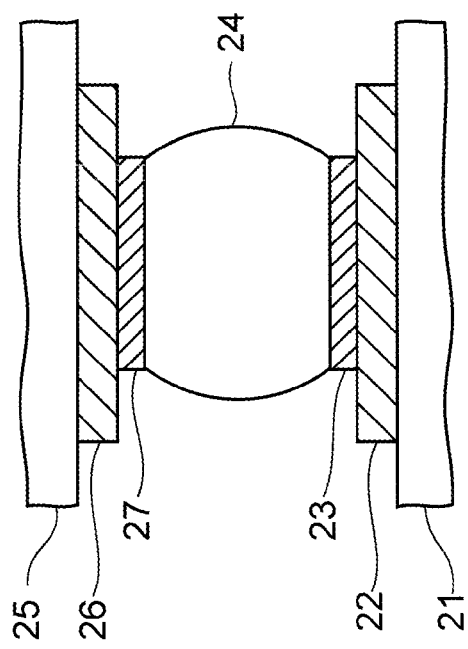

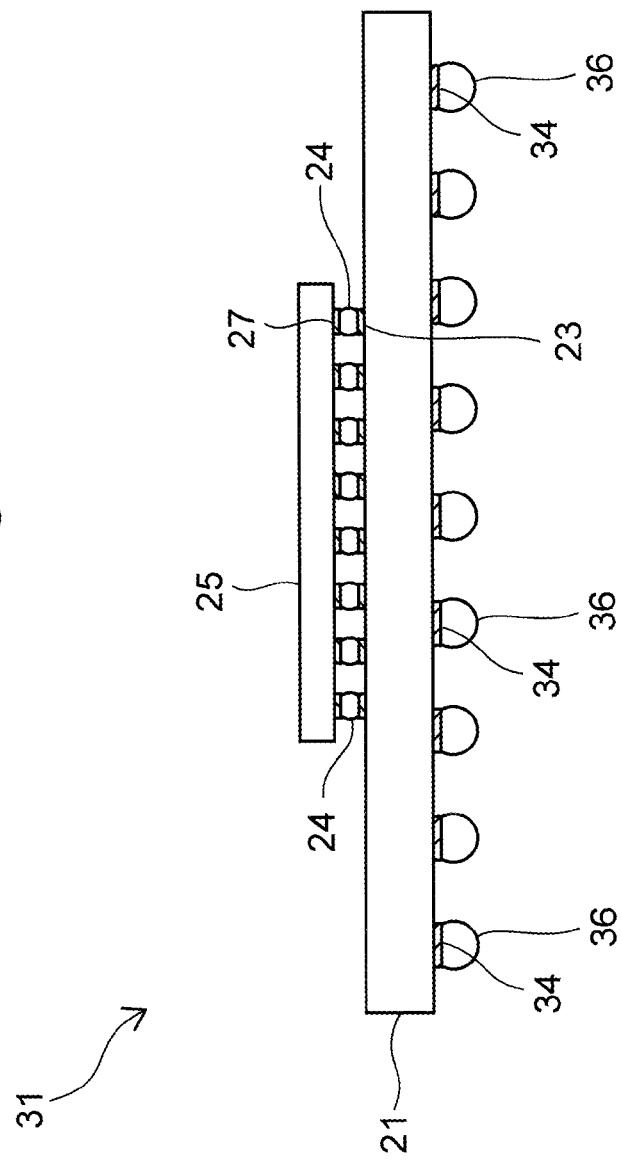

Fig. 8

| | sample number | layer structure | | | |
|---|---|---|---|---|---|
| first example (Fig. 5A) | P1 | nickel film 23a | Ni of electrolytic plating, film thickness 1~2μm | gold film 23b | Au of electrolytic plating, film thickness 0.1μm |
| | P2 | nickel film 23a | Ni of non-electrolytic plating, film thickness 4~6μm | gold film 23b | Au of non-electrolytic plating, film thickness 0.3μm |
| second example (Fig. 5B) | P3 | nickel film 23a | Ni of electrolytic plating, film thickness 1~2μm | palladium 23c | Pd of non-electrolytic plating, film thickness 0.01μm | gold film 23b | Au of electrolytic plating, film thickness 0.01μm |
| | P4 | nickel film 23a | Ni of non-electrolytic plating, film thickness 4~6μm | palladium 23c | Pd of electrolytic plating, film thickness 0.05μm | gold film 23b | Au of non-electrolytic plating, film thickness 0.075μm |

Fig. 9

| profile number | $T_0$ | time t |
|---|---|---|
| temperature profile 1 | solidus temperature | 15 second |
| temperature profile 2 | solidus temperature | 30 second |
| temperature profile 3 | 150°C | 15 second |
| temperature profile 4 | 150°C | 30 second |

Fig. 10

| samples of the first barrier metal film 23 | number of temperature profile |
|---|---|
| P1 | temperature profile 1 |
| P1 | temperature profile 2 |
| P1 | temperature profile 3 |
| P1 | temperature profile 4 |
| P2 | temperature profile 1 |
| P2 | temperature profile 2 |
| P2 | temperature profile 3 |
| P2 | temperature profile 4 |
| P3 | temperature profile 1 |
| P3 | temperature profile 2 |
| P3 | temperature profile 3 |
| P3 | temperature profile 4 |
| P4 | temperature profile 1 |
| P4 | temperature profile 2 |
| P4 | temperature profile 3 |
| P4 | temperature profile 4 |

Fig. 11

| samples | compositions of solder | Sn remaining portion | Bi Wt% | Zn Wt% | Ag Wt% | Sb Wt% | Co Wt% | Ni Wt% | Al Wt% | Ge Wt% | P Wt% |
|---|---|---|---|---|---|---|---|---|---|---|---|
| S1 | Sn-57Bi-1.0Zn | Bal. | 57 | 1 | | | | | | | |
| S2 | Sn-57Bi-0.5Zn | Bal. | 57 | 0.5 | | | | | | | |
| S3 | Sn-57Bi-0.1Zn | Bal. | 57 | 0.1 | | | | | | | |
| S4 | Sn-57Bi-1.0Ag-1.0Zn | Bal. | 57 | 1 | 1 | | | | | | |
| S5 | Sn-57Bi-1.0Ag-0.5Zn | Bal. | 57 | 0.5 | 1 | | | | | | |
| S6 | Sn-57Bi-1.0Ag-0.1Zn | Bal. | 57 | 0.1 | 1 | | | | | | |
| S7 | Sn-57Bi-0.5Sb-1.0Zn | Bal. | 57 | 1 | | 0.5 | | | | | |
| S8 | Sn-57Bi-0.5Sb-0.5Zn | Bal. | 57 | 0.5 | | 0.5 | | | | | |
| S9 | Sn-57Bi-0.5Sb-0.1Zn | Bal. | 57 | 0.1 | | 0.5 | | | | | |
| S10 | Sn-57Bi-0.5Co-1.0Zn | Bal. | 57 | 1 | | | 0.5 | | | | |
| S11 | Sn-57Bi-0.5Co-0.5Zn | Bal. | 57 | 0.5 | | | 0.5 | | | | |
| S12 | Sn-57Bi-0.5Co-0.1Zn | Bal. | 57 | 0.1 | | | 0.5 | | | | |
| S13 | Sn-57Bi-0.5Ni-1.0Zn | Bal. | 57 | 1 | | | | 0.5 | | | |
| S14 | Sn-57Bi-0.5Ni-0.5Zn | Bal. | 57 | 0.5 | | | | 0.5 | | | |
| S15 | Sn-57Bi-0.5Ni-0.1Zn | Bal. | 57 | 0.1 | | | | 0.5 | | | |
| S16 | Sn-57Bi-0.01Al-1.0Zn | Bal. | 57 | 1 | | | | | 0.01 | | |
| S17 | Sn-57Bi-0.01Al-0.5Zn | Bal. | 57 | 0.5 | | | | | 0.01 | | |
| S18 | Sn-57Bi-0.01Al-0.1Zn | Bal. | 57 | 0.1 | | | | | 0.01 | | |
| S19 | Sn-57Bi-0.5Ge-1.0Zn | Bal. | 57 | 1 | | | | | | 0.5 | |
| S20 | Sn-57Bi-0.5Ge-0.5Zn | Bal. | 57 | 0.5 | | | | | | 0.5 | |
| S21 | Sn-57Bi-0.5Ge-0.1Zn | Bal. | 57 | 0.1 | | | | | | 0.5 | |
| S22 | Sn-57Bi-0.05P-1.0Zn | Bal. | 57 | 1 | | | | | | | 0.05 |
| S23 | Sn-57Bi-0.05P-0.5Zn | Bal. | 57 | 0.5 | | | | | | | 0.05 |
| S24 | Sn-57Bi-0.05P-0.1Zn | Bal. | 57 | 0.1 | | | | | | | 0.05 |

METHOD OF MANUFACTURING SEMICONDUCTOR DEVICE CAPABLE OF ENHANCING BONDING STRENGTH BETWEEN CONNECTION TERMINAL AND ELECTRODE

CROSS-REFERENCE TO RELATED APPLICATION(S)

This application is based upon and claims the benefit of priority of the prior Japanese Patent Application No. 2013-013433, filed on Jan. 28, 2013, the entire contents of which are incorporated herein by reference.

FIELD

The embodiments discussed herein are related to a semiconductor device and a method of manufacturing the semiconductor device.

BACKGROUND

As for semiconductor elements mounted on a wiring board, the number of connection terminals thereof is increasing, and also the pitch between each of the connection terminals is more and more narrowing. Flip-chip mounting is a mounting technique to cope with such an increased number of connection terminals and narrowed pitch.

In the flip-chip mounting, connection terminals made of solder bumps or the like are made to reflow, and thereby a wiring board and electrodes of a semiconductor element are connected to each other through the connection terminals.

The reflow of the connection terminals involves heating of the semiconductor element and the wiring board. However, a difference in thermal expansion coefficient between the semiconductor element and the wiring board may cause the semiconductor element to be damaged during the reflow.

In order to inhibit such damage, it is effective to use a material having as low a melting point possible as a material for the connection terminals made of solder bumps or the like, and thereby lower the heating temperature during the reflow.

Lead-free solder is widely used as a material for the connection terminals, but is not suitable for such low-temperature reflow because of its high melting point. A Sn—Ag—Cu-based lead-free solder, for example, has a high melting point of 217° C.

Therefore, a Sn—Bi-based solder having a low melting point of 139° C. and having a eutectic point composition is often used as the material for the connection terminals.

However, the connection terminals formed using the Sn—Bi-based solder still have room for improvement in terms of the enhancement of the bonding strength with the electrodes.

Note that techniques related to the present application are disclosed in Japanese Laid-open Patent Publications Nos. 2012-157873 and 2010-167472.

SUMMARY

According to one aspect of the following disclosure, there is provided a method of manufacturing a semiconductor device, including forming a barrier metal film on a surface of at least one of a first electrode of a wiring board and a second electrode of a semiconductor element, providing a connection terminal between the first and second electrodes, the connection terminal being made of solder containing tin, bismuth and zinc, and bonding the connection terminal to the barrier metal film by heating the connection terminal and maintaining the temperature of the connection terminal at a constant temperature not lower than a solidus temperature of the solder for a constant period of time.

According to another aspect of the disclosure, there is provided a semiconductor device including a wiring board including a first electrode, a semiconductor element including a second electrode, a barrier metal film provided on a surface of any one of the first electrode and the second electrode, and a connection terminal provided between the first and second electrodes, bonded to the barrier metal film, and made of solder containing tin, bismuth and zinc, wherein an alloy layer made of a material of the barrier metal film and the zinc is formed between the barrier metal film and the connection terminal.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIGS. 1A and 1B are enlarged cross-sectional views of a semiconductor device in the course of manufacturing thereof, which is used for examination;

FIGS. 2A and 2B are enlarged cross-sectional views of a semiconductor device in the course of manufacturing thereof according to an embodiment;

FIG. 3 is an overall cross-sectional view of the semiconductor device according to the embodiment;

FIG. 8 is a table for explaining a layer structure of a sample of the first barrier metal film used in an experiment;

FIG. 9 is a table for explaining a reflow temperature profile used in the experiment;

FIG. 10 is a table illustrating combinations of the samples of the first barrier metal film and the reflow temperature profiles used in the experiment; and FIG. 11 is a table illustrating compositions of solder samples used as materials for the connection terminals in the experiment.

DESCRIPTION OF EMBODIMENTS

Figure 4:
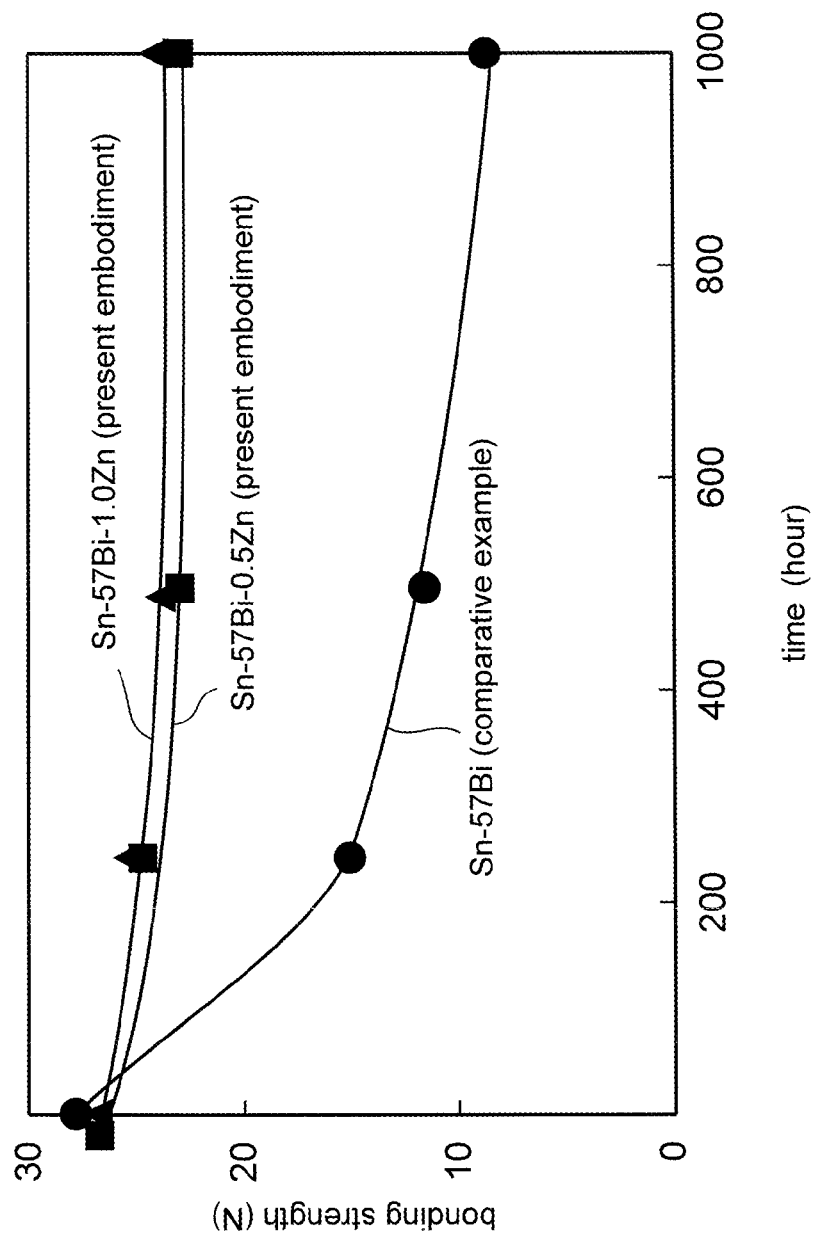
FIG. 4 is a graph obtained by examining bonding strength of connection terminals.

Prior to description of embodiments, an examination conducted by the inventors of the present application will be described.

As described above, in order to reduce damage on a semiconductor element, it is effective to use a solder having as low a melting point as possible as a material for connection terminals connecting the semiconductor element to a wiring board.

Therefore, in this examination, an Sn—Bi solder widely used as a low melting point solder is used as the material for the connection terminals to examine bonding strength between electrodes and the connection terminals.

FIGS. 1A and 1B are enlarged cross-sectional views of a semiconductor device in the course of manufacturing in the examination.

First, as illustrated in FIG. 1A, a wiring board 1 and a semiconductor element 10 such as an LSI (Large Scale Integration) are prepared.

A first electrode 2 made of copper is provided on a surface of the wiring board 1, and a first barrier metal film 5 is formed on the first electrode 2 by laminating a nickel film 3 and a gold film 4 in this order.

The nickel film 3 is formed in a thickness of about 4 μm to 6 μm by non-electrolytic plating, and contains a small amount of phosphorus which is contained in a plating solution. Also, the gold film 4 is formed in a thickness of about 0.1 μm to 0.3 μm by non-electrolytic plating.

Meanwhile, on a surface of the semiconductor element 10, a second electrode 11 made of copper is provided. On the second electrode 11, a second barrier metal film 14 is formed by laminating a nickel film 12 and a gold film 13 in this order. Specifically, the nickel film 12 is formed in a thickness of about 1 μm to 2 μm by electrolytic plating, and the gold film 13 is formed in a thickness of about 0.1 μm to 0.3 μm by electrolytic plating.

A connection terminal 8 is bonded to the second barrier metal film 14 in advance. A material of the connection terminal 8 is Sn-57Bi solder, which is an example of the Sn—Bi solder, whose solidus temperature is as low as 139° C.

Then, the connection terminal 8 is made to come into contact with the first barrier metal film 5, and the connection terminal 8 is heated to be melted. In this event, the gold films 4 and 13 formed as the uppermost layers of the respective barrier metal films 5 and 14 make the surfaces of the barrier metal films 5 and 14 have good wettability of the Sn-57Bi solder.

Also, the first barrier metal film 5 formed on the first electrode 2 made of copper prevents copper from diffusing out from the first electrode 2 into the connection terminal 8.

With this state maintained, tin in the melted connection terminal 8 reacts with nickel in each of the barrier metal films 5 and 14 as illustrated in FIG. 1B. As a result, an alloy layer 7 of tin and nickel is formed in each of the barrier metal films 5 and 14, and the connection terminal 8 is bonded to both the electrodes 2 and 11 via the alloy layers 7.

Thus, a basic structure of a semiconductor device 15 having the semiconductor element 10 mounted on the wiring board 1 is obtained.

Here, during the formation of the alloy layer 7 in the step of FIG. 1B, tin which is more reactive than bismuth in the connection terminal 8 preferentially reacts with the barrier metal films 5 and 14. Therefore, unreacted bismuth may be left around interfaces X between the connection terminal 8 and the barrier metal films 5 and 14, which in turn causes local segregation of bismuth.

Bismuth contributes to lowering the melting point of the connection terminal 8, but is mechanically hard and fragile. When bismuth is segregated on the interfaces X as described above, the bonding strength between the connection terminal 8 and the electrodes 2 and 11 is lowered and thus reliability of the semiconductor device 15 is lowered.

In the following, description will be given of an embodiment which prevents lowering of the reliability of the semiconductor device even when bismuth is used as the material for the connection terminal.

Embodiment

In the present embodiment, segregation of bismuth in a connection terminal is prevented by adding zinc having a good reactivity with a barrier metal film to the connection terminal as described below.

FIGS. 2A and 2B are enlarged cross-sectional views of a semiconductor device in the course of manufacturing thereof according to the present embodiment.

First, as illustrated in FIG. 2A, a wiring board 21 and a semiconductor element 25 such as an LSI are prepared.

A first electrode 22 made of copper is provided on a surface of the wiring board 21, and a first barrier metal film 23 is formed on the first electrode 22. Also, a second electrode 26 made of copper is provided on a surface of the semiconductor element 25, and a second barrier metal film 27 is formed on the second electrode 26.

Note that a preferred layer structure of the first barrier metal film 23 and the second barrier metal film 27 will be described later.

A solder bump having a diameter of about 0.6 mm is bonded in advance as a connection terminal 24 to the second barrier metal film 27.

The solder as the material for the connection terminal 24 is mainly made of tin and bismuth, and contains zinc as an add-in material. The component composition of the solder is not particularly limited. The present embodiment uses a solder expressed by Sn-57Bi-xZn (0.1≤x≤1) with a eutectic composition of tin and bismuth. The inclusion of bismuth lowers a solidus temperature of the solder to about 139° C.

Then, under the state where the connection terminal 24 is provided between the first and second barrier metal films 23 and 27, the connection terminal is heated to be melted by reflow. Preferred conditions for the reflow will be described later.

As described above, the solder as the material of the connection terminal 24 has the low solidus temperature of about 139° C. Therefore, temperature for melting the connection terminal 24 is able to be lowered, and hence damage to be inflicted on the semiconductor element 25 during the reflow is reduced.

Thereafter, by maintaining the melted state of the connection terminal 24, alloy layers 30 of the materials of the connection terminal 24 and the barrier metal films 23 and 27 are formed. Thus, the connection terminal 24 is bonded to the electrodes 22 and 26 via the alloy layers 30.

Here, in the melted connection terminal 24, the reactivity of zinc contained therein is much higher than remaining tin. Therefore, during the formation of the alloy layers 30, zinc reacts with the barrier metal films 23 and 27 more preferentially than tin. Accordingly, the alloy layers 30 are mainly formed of tin alloy.

Moreover, most of tin and bismuth having lower reactivity than zinc coexist in the connection terminal 24 in an unreacted state. Thus, segregation of bismuth alone at the interfaces Y between the connection terminal 24 and the barrier metal films 23 and 27 is prevented. As a result, it is possible to prevent the reduction in bonding strength between the connection terminal 24 and the electrodes 22 and 26 due to mechanically fragile bismuth.

As described above, zinc added to the connection terminal 24 plays a role of allowing tin and bismuth to coexist in the connection terminal 24 by inhibiting tin in the connection terminal 24 from reacting with the barrier metal films 23 and 27.

However, since zinc is more easily oxidized than tin, addition of large amounts of zinc to the connection terminal 24 causes an oxide layer to be formed on the surface of the connection terminal 24. This may hinder good electrical connection of the electrodes 22 and 26 through the connection terminal 24. In order to prevent formation of the oxide layer on the connection terminal 24, it is preferable that the concentration of zinc in the connection terminal 24 is set to 1 wt % or less.

On the other hand, when the concentration of zinc is too low, zinc in such low concentration has difficulty in inhibiting the segregation of bismuth in the connection terminal 24. For this reason, it is preferable to effectively inhibit the segregation of bismuth by setting the concentration of zinc in the connection terminal 24 to 0.1 wt % or more.

Moreover, in order to prevent the connection terminal 24 from being oxidized by the reflow, it is preferable that the reflow is performed in a nitrogen atmosphere with the oxygen concentration reduced to 1000 ppm or less.

Furthermore, the provision of the first barrier metal film 23 inhibits diffusion of copper into the connection terminal 24 from the first electrode 22. This prevents a relative increase in the concentration of bismuth in the connection terminal 24 due to the reaction between tin and copper, and the segregation of bismuth in the connection terminal 24 is inhibited. As a result, the bonding strength between the connection terminal 24 and the first electrode 22 is enhanced. Similarly, the second barrier metal film 27 also prevents copper from being diffused into the connection terminal 24 from the second electrode 26.

Thus, a basic structure of a semiconductor device 31 having the semiconductor element 25 mounted on the wiring board 21 is completed.

FIG. 3 is an overall cross-sectional view of the semiconductor device 31.

As illustrated in FIG. 3, a plurality of pads 34 made of copper are provided on a principal surface of the wiring board 21, which is on the opposite side to the one where the semiconductor element 25 is mounted. Also, as external connection terminals, solder bumps 36 are bonded to the pads 34. The semiconductor device 31 thus configured is also called a BGA (Ball Grid Array) semiconductor device.

Note that, in order to enhance the mechanical connection strength between the wiring board 21 and the semiconductor element 25, an underfill resin may be provided therebetween.

In the present embodiment described above, the connection terminal 24 is added with zinc having a higher reactivity with the barrier metal films 23 and than tin, thereby preventing the segregation of bismuth in the connection terminal 24. Thus, the bonding strength between the connection terminal 24 and the electrodes 22 and 26 is enhanced.

The inventors of the present application examined how much the bonding strength of the connection terminal 24 is enhanced.

FIG. 4 illustrates the results of the examination.

In this examination, after the connection terminal 24 is bonded to the electrodes 22 and 26 as described above, the connection terminal 24 is heated to 125° C. to speed up the segregation of bismuth, and thus an accelerated test is conducted.

In FIG. 4, the horizontal axis indicates the time for which the connection terminal 24 is heated as described above, while the vertical axis indicates the bonding strength between the first electrode 22 and the connection terminal 24. Note that the bonding strength is defined as the force applied when the connection terminal 24 is peeled off from the first electrode 22, while increasing the force in a direction to which the connection terminal 24 peels off from the wiring board 21.

The bonding strength is examined for each of the cases where Sn-57Bi-1.0Zn is used as the material for the connection terminal 24 and where Sn-57Bi-0.5Zn is used as the material thereof. Note that nickel is used as the material for the first barrier metal film 23.

Moreover, in the examination, the bonding strength between the connection terminal 8 and the first electrode 2 illustrated in FIG. 1B is also examined as a comparative example. As described above, Sn-57Bi solder having no zinc added is used as the material for the connection terminal 8 in the comparative example.

As illustrated in FIG. 4, in the comparative example, the bonding strength abruptly drops over time. This is considered to be caused by continuously heating the connection terminal 8 and hence the segregation of bismuth in the connection terminal 8 speeds up.

In the present embodiment, on the other hand, reduction in bonding strength is suppressed in both of the cases of Sn-57Bi-1.0Zn and Sn-57Bi-0.5Zn. This confirms that the bonding strength between the connection terminal 24 and the first electrode 22 is actually maintained by adding zinc to the solder mainly made of tin and bismuth and using the solder as the material for the connection terminal 24.

Next, description will be given of the preferred layer structure of the first barrier metal film 23 described above.

Figure 5A:
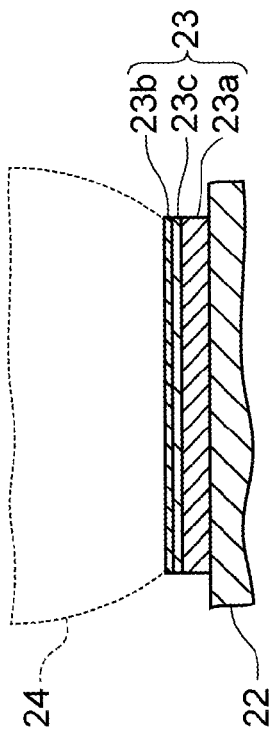
FIG. 5A is a cross-sectional view of a first barrier metal film according to a first example of the embodiment.

FIG. 5A is a cross-sectional view of the first barrier metal film 23 according to a first example in a state before bonding of the connection terminal 24.

In this example, a nickel film 23a and a gold film 23b are formed in this order on the first electrode 22, and these metal layers are used as the first barrier metal film 23.

Among these films, the nickel film 23a is excellent in ability to prevent diffusion of copper. Therefore, the nickel film 23a inhibits diffusion of copper from the first electrode 22 into the connection terminal 24.

As a method of forming the nickel film 23a, there are electrolytic plating and non-electrolytic plating. When the nickel film 23a is formed by non-electrolytic plating, the nickel film 23a contains a minute amount of phosphorus which is contained in a plating solution. Nickel containing phosphorus as described above is also referred to as NiP.

Also, the thickness of the nickel film 23a is not particularly limited. When the nickel film 23a is formed by non-electrolytic plating, the thickness of the film 23a is about 4 µm to 6 µm, for example. On the other hand, when a NiP film is formed as the nickel film 23a by electrolytic plating, the thickness of the film 23a is 1 µm to 2 µm, for example.

Meanwhile, the gold film 23b in the uppermost layer of the first barrier metal film 23 plays a role in improving the wettability of the connection terminal 24 on the first barrier metal film 23. The gold film 23b is formed by non-electrolytic plating, for example, and the thickness is about 0.3 µm.

Figure 5B:
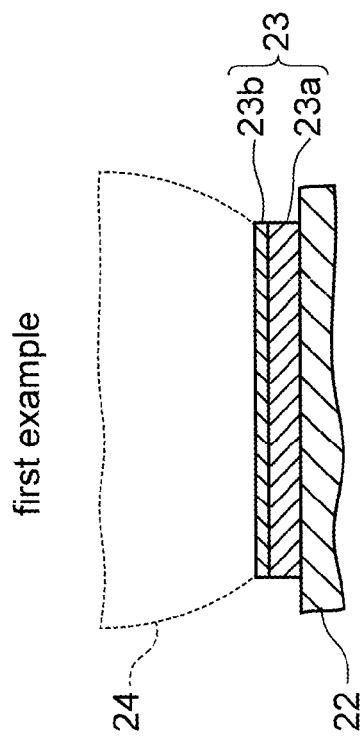
FIG. 5B is a cross-sectional view of a first barrier metal film according to a second example of the embodiment.

FIG. 5B is a cross-sectional view of the first barrier metal film 23 according to a second example in a state before bonding of the connection terminal 24.

In the second example, a palladium film 23c is provided between the nickel film 23a and the gold film 23b described in the first example.

The palladium film 23c has a function to improve the wettability of the connection terminal 24 as in the case of the gold film 23b. Thus, the wettability of the connection terminal 24 is maintained, while reducing the cost for forming the expensive gold film 23b by reducing the thickness of the gold film 23b.

Although the thickness of the palladium film 23c is not particularly limited, the palladium film 23c is formed in a thickness of about 0.05 μm by non-electrolytic plating in this example.

Also, in the second example, the gold film 23b may be reduced in thickness as described above. Thus, in the present embodiment, the gold film 23b is formed in a thickness of about 0.075 μm by flash plating.

Note that a method of forming the nickel film 23a is the same as that in the first example. The nickel film 23a may be formed by electrolytic plating, or a NiP film may be formed as the nickel film 23a by non-electrolytic plating. When the nickel film 23a is formed by non-electrolytic plating, the thickness of the nickel film 23 is about 4 μm to 6 μm, for example. On the other hand, when the NiP film is formed as the nickel film 23a by electrolytic plating, the thickness of the nickel film 23a is 1 μm to 2 μm, for example.

Although the layer structure of the first barrier metal film 23 is described above, the second barrier metal film 27 may also adopt the same layer structure as that illustrated in FIGS. 5A and 5B.

Figure 6A:
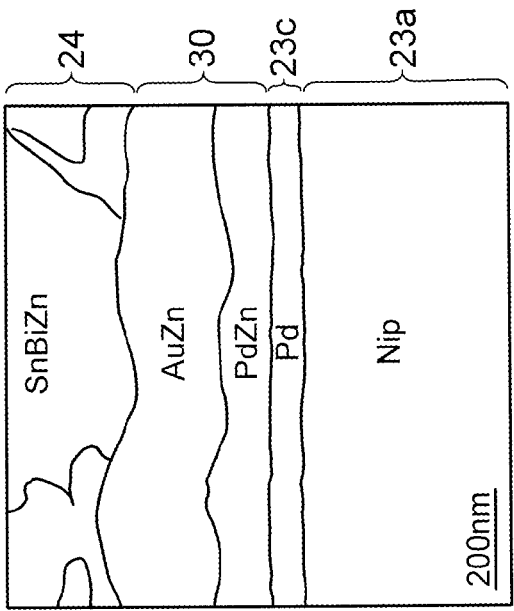
FIGS. 6A and 6B are diagrams drawn based on cross-sectional BF STEM (Bright Field Scanning Transmission Electron Microscope) images when the connection terminal is bonded to the first barrier metal film according to the respective examples of FIGS. 5A and 5B.
Figure 6B:
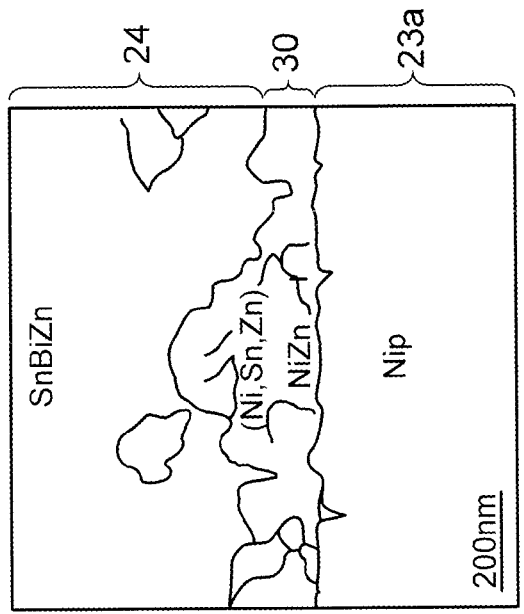

FIGS. 6A and 6B are diagrams drawn based on cross-sectional BF STEM (Bright Field Scanning Transmission Electron Microscope) images when the connection terminal 24 is bonded to the first barrier metal film 23 according to the respective examples of FIGS. 5A and 5B. Note that a NiP film is formed by non-electrolytic plating as the nickel film 23a in each of the examples of FIGS. 6A and 6B.

In the first example, as illustrated in FIG. 6A, reaction between a surface layer portion of the nickel film 23a and zinc in the connection terminal 24 causes an alloy layer 30 mainly made of NiZn to be formed at an interface between—the first barrier metal film 23 and the connection terminal 24. Note that the gold film 23b formed in the uppermost layer of the first barrier metal film 23 is thin and thus does not appear in the BF STEM image.

Meanwhile, in the second example, as illustrated in FIG. 6B, an alloy layer 30 containing AuZn and PbZn is formed. The alloy layer 30 is formed by the reaction of the gold film 23b and a surface layer portion of the palladium film 23c with zinc contained in the connection terminal 24.

In both of the first and second examples, unreacted tin, bismuth and zinc, which are not reacted with the first barrier metal film 23, coexist in the connection terminal 24 above the alloy layer 30.

Next, description will be given of preferred reflow conditions for the connection terminal 24 according to the present embodiment.

As described above, the connection terminal 24 is melted by reflow in the step of FIG. 2B in the present embodiment.

Figure 7:
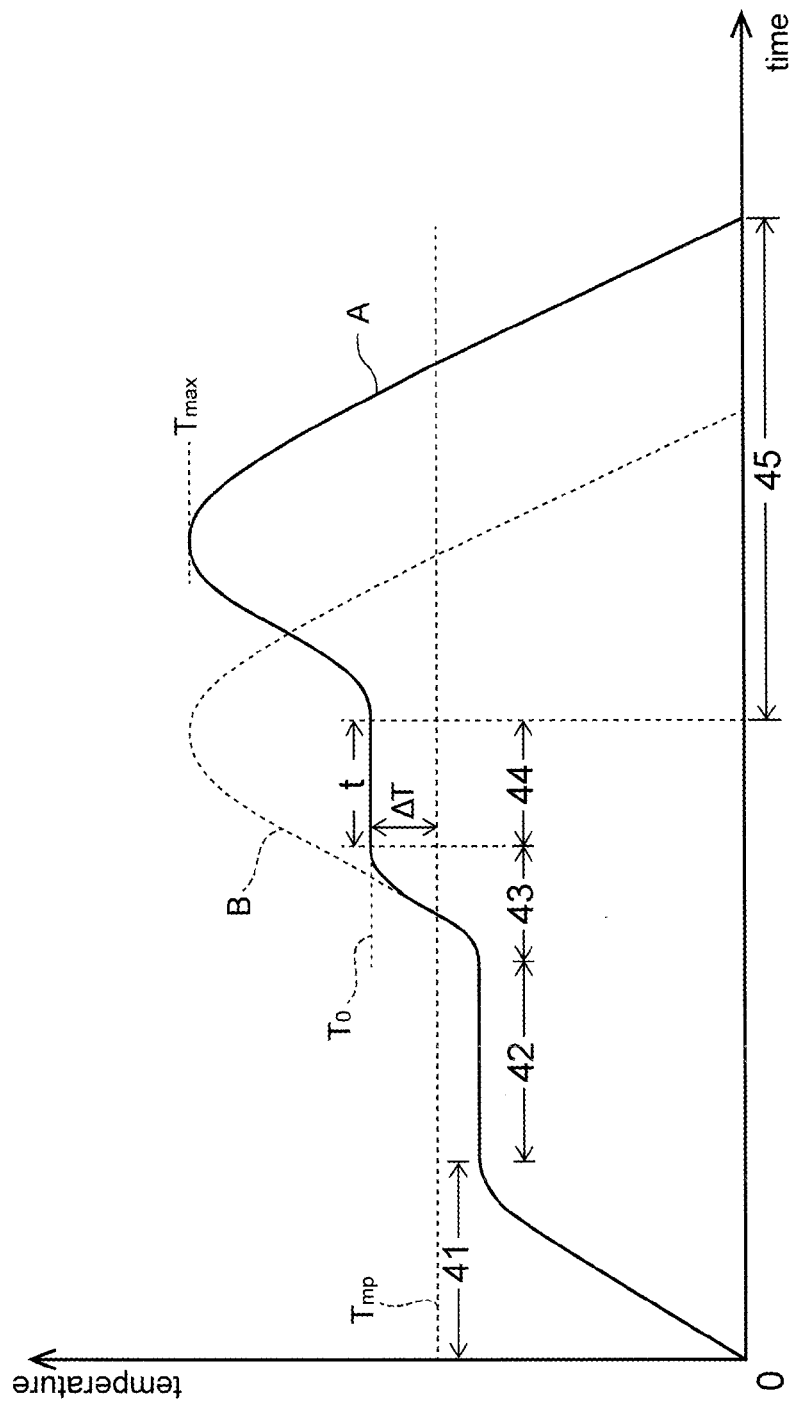
FIG. 7 is a graph illustrating a reflow temperature profile according to the embodiment.

FIG. 7 is a graph illustrating a temperature profile during the reflow. The horizontal axis indicates the reflow time, and the vertical axis indicates the temperature of the connection terminal 24.

Also, in FIG. 7, Graph A indicated by the solid line represents the temperature profile according to the present embodiment, while Graph B indicated by the dotted line represents the temperature profile according to the comparative example.

Note that, as described above, in order to prevent the connection terminal 24 from being oxidized during the reflow, the reflow is performed in a nitrogen atmosphere with the oxygen concentration reduced to 1000 ppm or less in this example.

As illustrated in Graph A, the temperature profile in the present embodiment is divided into first to fifth periods 41 to 45.

In the first period 41, reflow is started to raise the temperature of the connection terminal 24, and then the temperature rising is stopped before the temperature of the connection terminal 24 reaches its solidus temperature $T_{mp}$.

In the next second period 42, by maintaining the connection terminal 24 at constant temperature, the constituent components of both the wiring board 21 and the semiconductor element 25 are kept warmed.

Thereafter, in the third period 43, the temperature rising of the connection terminal 24 is resumed to heat the connection terminal 24 to the temperature equal to or higher than the solidus temperature $T_{mp}$ of the connection terminal 24, and thus the connection terminal 24 is melted.

Here, in the present embodiment, the temperature rising is stopped again when the connection terminal 24 reaches the temperature higher than its solidus temperature $T_{mp}$ by a predetermined temperature $\Delta T$. Then, in the fourth period 44, the connection terminal 24 is maintained at a constant temperature $T_0$ ($=T_{mp}+\Delta T$).

By maintaining the connection terminal 24 at the temperature $T_0$ not lower than the solidus temperature $T_{mp}$ as described above, a sufficient time is secured for the first barrier metal film 23 to be in contact with the melted connection terminal 24. As a result, the formation of the alloy layer 30 described above is promoted. Thus, the alloy layer 30 is formed to have a uniform thickness over the whole surface of the first barrier metal film 23. Accordingly, the bonding strength between the first barrier metal film 23 and the connection terminal 24 is enhanced.

Although the predetermined temperature $\Delta T$ described above is not particularly limited, it is preferable to adopt the temperature $\Delta T$ at which solid-phase solder and liquid-phase solder coexist in the connection terminal 24. Such coexistence of the solid-phase solder and the liquid-phase solder allows the formation of the alloy layer 30 to progress more slowly than the case where the entire connection terminal 24 is in the liquid-phase. Thus, the alloy layer 30 having a uniform thickness is more easily formed, and effective improvement in the bonding strength described above is achieved by the alloy layer 30 of the stable shape.

Note that the range of the temperature $\Delta T$ at which the solid-phase solder and the liquid-phase solder coexist as described above is 0° C.≤$\Delta A$≤10° C., for example.

When the time t of the fourth period 44 is short, the formation of the alloy layer 30 becomes difficult. Thus, it is preferable to form the alloy layer 30 having a sufficient thickness to improve the bonding strength by setting the time t to 15 seconds or more.

Thereafter, in the fifth period 45, the temperature rising of the connection terminal 24 is resumed to heat the connection terminal 24 to the maximum temperature $T_{max}$ (about 180° C.) of the reflow, thereby setting approximately the entire connection terminal 24 in the liquid phase. Thus, variation in composition of the elements in the connection terminal is reduced. Accordingly, the segregation of bismuth in the connection terminal 24 is more effectively inhibited. As a result, the bonding strength between the connection terminal 24 and the electrodes 22 and 26 is further improved.

Subsequently, the connection terminal 24 is cooled to room temperature to be solidified. Thus, the wiring board 21 and the semiconductor element 25 are mechanically connected via the connection terminal 24.

In the present embodiment, by maintaining the connection terminal 24 at the constant temperature $T_0$ not lower than the solidus temperature $T_{mp}$ in the fourth period 44 as described above, the formation of the alloy layer 30 is promoted to improve the bonding strength between the connection terminal 24 and the first electrode 22.

Note that Graph B of the comparative example has no period for which the connection terminal is maintained at the constant temperature $T_0$. Thus, rapid formation of the alloy layer 30 makes the thickness of the alloy layer 30 to be non-uniform. Therefore, it is considered to be difficult to improve the bonding strength between the connection terminal 24 and the first electrode 22 with the alloy layer 30.

Next, description will be given of an experiment conducted by the inventors of the present application.

FIG. 8 is a table for explaining layer structures of samples P1 to P4 of the first barrier metal film 23 used in the experiment.

As described with reference to FIGS. 5A and 5B, there are the first and second examples for the first barrier metal film 23. Moreover, in both of the first and second examples, the nickel film 23a is formed in the first barrier metal film 23. As described above, there are two kinds of methods, electrolytic plating and non-electrolytic plating, as the method of forming the nickel film 23a.

In this experiment, electrolytic plating and non-electrolytic plating are used as the method of forming the nickel film 23a in each of the first and second examples, as illustrated in FIG. 8. Thus, four samples P1 to P4 are formed in total.

Meanwhile, as the reflow temperature profile, four temperature profiles illustrated in FIG. 9 are used.

Each of the temperature profiles has the same shape as that of Graph A illustrated in FIG. 7. However, in this experiment, four temperature profiles 1 to 4 are used in total by adopting the solidus temperature and 150° C. as the constant temperature $T_0$ in the fourth period 44 (see FIG. 7) and also adopting 15 seconds and 30 seconds as the time t in the fourth period 44.

Note that, in the temperature profiles 1 and 2 with the "solidus temperature" set as the temperature $T_0$, the solidus temperature $T_{mp}$ (about 139° C.) of the connection terminal 24 is adopted as the constant temperature $T_0$ in the fourth period 44. Meanwhile, in the temperature profiles 3 and 4 with "150° C." set as the temperature $T_0$, 150° C. which is about 10° C. higher than the solidus temperature $T_{mp}$ (about 139° C.) of the connection terminal 24 is adopted as the constant temperature $T_0$ in the fourth period 44.

The four samples P1 to P4 in FIG. 8 and the four temperature profiles in FIG. 9 correspond to a total of sixteen (4×4) combinations of the first barrier metal film 23 and the temperature profile.

FIG. 10 is a table illustrating the sixteen combinations described above.

In this experiment, for all of the sixteen combinations, the bonding strength between the first electrode 22 and the connection terminal 24 is measured using the solder having the following composition.

FIG. 11 is a table illustrating compositions of solder samples S1 to S21 used as the material for the connection terminal 24 in the experiment. Note that the solder compositions are expressed by mass percentage in FIG. 11. Also, blank cells indicate that there is no composition corresponding to those cells. And the tin concentration "Bal." indicates that the tin concentration is balanced so that the mass percentage of the entire solder becomes 100 wt %.

All of the solder samples S1 to S24 are mainly made of tin and bismuth, and zinc is used as the add-in material.

Note that, in the samples S1 to S3, only zinc is used as the add-in material and no other add-in materials than zinc are used.

Also, silver (Ag) is further used as the add-in material in the samples S4 to S6, and antimony (Sb) is further used as the add-in material in the samples S7 to S9. Moreover, cobalt (Co) is further used as the add-in material in the samples S10 to S12, and nickel (Ni) is further used as the add-in material in the samples S13 to S15. Furthermore, aluminum (Al) is further used as the add-in material in the samples S16 to S18, and germanium is further used as the add-in material in the samples S19 to S21. In the samples S22 to S24, phosphorus is further used as the add-in material.

As a result of the experiment, in the samples S1 to S24 containing zinc as the add-in material, the bonding strength between the first electrode 22 and the connection terminal 24 is 20 N or more even after the both are bonded and then heated for 500 hours at 125° C. for all the sixteen combinations in FIG. 10.

The above result shows that zinc is effective in improving the bonding strength and also that the bonding strength is improved even when any of silver, antimony, cobalt, nickel, aluminum, phosphorus and germanium is added to the solder other than zinc.

It is also confirmed that, particularly when the palladium film 23c is included in the first barrier metal film 23 as in the case of the samples P3 and P4 in FIG. 8, the bonding strength is 1.2 or more times higher than the other samples P1 and P2.

On the other hand, in the comparative example using the Sn-57Bi solder with no zinc added as the connection terminal 24 as illustrated in FIG. 4, the bonding strength is reduced to about half of that in the present embodiment when the heating time is set to 500 hours under the same conditions as those of the experiment.

This confirms that the bonding strength between the first electrode 22 and the connection terminal 24 is improved compared with the comparative example for the four layer structures of the first barrier metal film 23 in FIG. 8, the four temperature profiles in FIG. 9 and all the twenty-one combinations of the solder composition in FIG. 10.

Furthermore, the inventors of the present application conducted the following test to evaluate the reliability of the semiconductor device 31 (see FIG. 3) according to the present embodiment.

The test is a temperature cycle test in which cooling and heating of the semiconductor device 31 are repeated for 500 cycles between 25° C. and 125° C. After the temperature cycle test, the semiconductor device 31 according to the present embodiment has a good rise rate of the resistance between the electrodes 22 and 26, which is 10% or less. Moreover, even when the semiconductor device 31 is left in hot and humid conditions with the temperature of 121° C. and the humidity of 85% for 1000 hours, the rise rate of the resistance is kept as low as 10% or less as in the case of the temperature cycle test.

On the other hand, in the comparative example using the Sn-57Bi solder with no zinc added as the connection terminal 24, the rise rate of the resistance exceeds 10% after the same temperature cycle test. Moreover, when the semiconductor device according to the comparative example is left in hot and humid conditions with the temperature of 121° C. and the humidity of 85% for 1000 hours, the rise rate of the resistance exceeds 10%.

This result confirms that the present embodiment is also effective in improving the reliability of the semiconductor device.

While the present embodiment is described in detail above, the embodiment is not limited to the above.

For example, although any of silver, antimony, cobalt, nickel, aluminum, germanium and phosphorus is added alone to the solder as the material for the connection terminal 24 in FIG. 11, any combinations thereof may be added to the solder. In this case, the bonding strength between the connection terminal 24 and each of the electrodes 22 and 26 is also improved as in the above case.

Moreover, although the wiring board 21 and the semiconductor element 25 are connected via the connection terminal 24 according to the embodiment in FIG. 3, any active element or passive element may be connected to the wiring board 21 via the connection terminal 24. Furthermore, the use of the wiring board 21 is also not particularly limited. The wiring board 21 may be used for any electronic devices such as a server and a personal computer.

All examples and conditional language recited herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A method of manufacturing a semiconductor device, comprising:
    forming a barrier metal film on a surface of at least one of a first electrode of a wiring board and a second electrode of a semiconductor element;
    providing a connection terminal between the first and second electrodes, the connection terminal being made of solder containing tin, bismuth and zinc; and
    connecting the first electrode and the second electrode by bonding the connection terminal to the barrier metal film by heating the connection terminal and maintaining the temperature of the connection terminal at a constant temperature not lower than a solidus temperature of the solder for a certain period of time,
    wherein the constant temperature is a temperature at which solid-phase solder and liquid-phase solder coexist in the connection terminal.

2. The method of manufacturing a semiconductor device, according to claim 1, wherein the barrier metal film is a metal layer containing a nickel film.

3. The method of manufacturing a semiconductor device, according to claim 2, wherein the metal layer is a laminated film obtained by laminating the nickel film and a gold film in this order.

4. The method of manufacturing a semiconductor device, according to claim 2, wherein the metal layer is a laminated film obtained by laminating the nickel film, a palladium film and a gold film in this order.

5. The method of manufacturing a semiconductor device, according to claim 1, wherein the constant temperature is a temperature not higher than a temperature obtained by adding the solidus temperature with 10° C.

6. The method of manufacturing a semiconductor device, according to claim 1, wherein the certain period of time is 15 seconds or more.

7. The method of manufacturing a semiconductor device, according to claim 1, wherein, in the heating of the connection terminal, the temperature of the connection terminal is raised to a temperature higher than the constant temperature after a lapse of the certain period of time.

8. The method of manufacturing a semiconductor device, according to claim 1, wherein main components of the solder are the tin and the bismuth.

9. The method of manufacturing a semiconductor device according to claim 1, wherein the concentration of the zinc in the solder is more than 0.1 wt % and not more than 1 wt %.

10. The method of manufacturing a semiconductor device according to claim 1, wherein the solder consists of an alloy of the tin, the bismuth and the zinc, where any one of cobalt and phosphorous being added to the alloy.

11. The method of manufacturing a semiconductor device according to claim 1, wherein, in the heating of the connection terminal, the temperature of the connection terminal is raised, without being lowered, to a temperature higher than the constant temperature after a lapse of the certain period of time.

* * * * *